United States Patent [19]
Shaffer et al.

[11] Patent Number: 5,274,710
[45] Date of Patent: Dec. 28, 1993

[54] PEDAL VOLUME CONTROL FOR ELECTRIC INSTRUMENTS

[75] Inventors: Mark S. Shaffer, Seattle, Wash.; Samuel J. McRae, Clayton, Calif.

[73] Assignee: Dunlop Manufacturing, Inc., Benicia, Calif.

[21] Appl. No.: 798,504

[22] Filed: Nov. 26, 1991

[51] Int. Cl.⁵ .............................. H03G 3/00
[52] U.S. Cl. .................... 381/109; 381/118; 84/746; 338/153; 338/69; 338/108
[58] Field of Search .......... 84/746; 381/104, 109, 381/118; 338/153, 69, 108

[56] References Cited

U.S. PATENT DOCUMENTS

| | | |
|---|---|---|
| 2,297,829 | 10/1942 | Hammond, Jr. .............. 84/746 |
| 3,178,501 | 4/1965 | Evans ........................... 84/746 |
| 3,530,224 | 9/1970 | Plunkett et al. ............... 84/746 |
| 3,965,790 | 6/1976 | Suzuki et al. ................. 84/711 |

Primary Examiner—Forester W. Isen
Attorney, Agent, or Firm—Robert Charles Hill

[57] ABSTRACT

A variable impedance device which is connected between the preamplifier of a microphone or electric instrument and a public address system for controlling the signal volume of a musical performance. The variable resistor is controlled by a foot pedal operated by the performer so that his hands are free for an uninterrupted performance. The impedance includes a first section that can be preset manually to provide maximum desired signal volume with the footpedal in one direction (toe depressed on the pedal) and a second section that can be preset to provide minimum desired signal volume (heel depressed on the pedal).

7 Claims, 2 Drawing Sheets

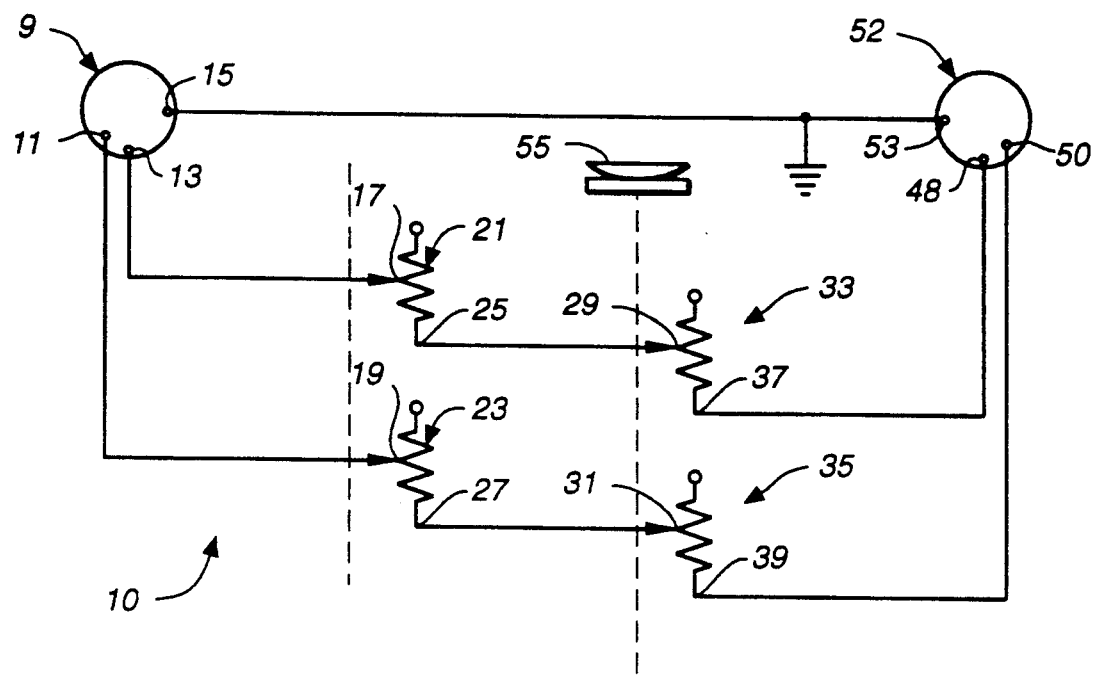
FIG._1
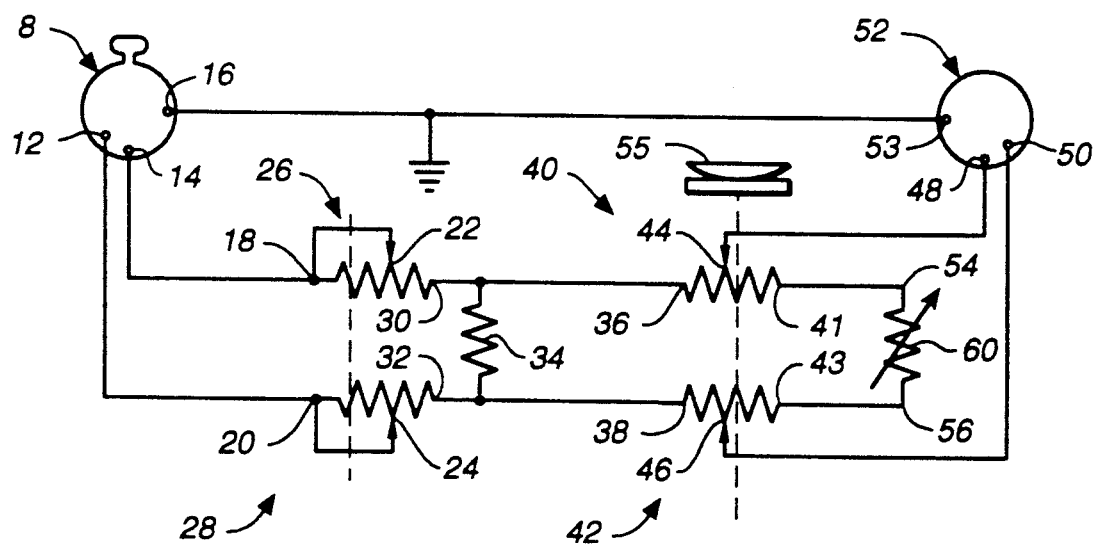
FIG._2

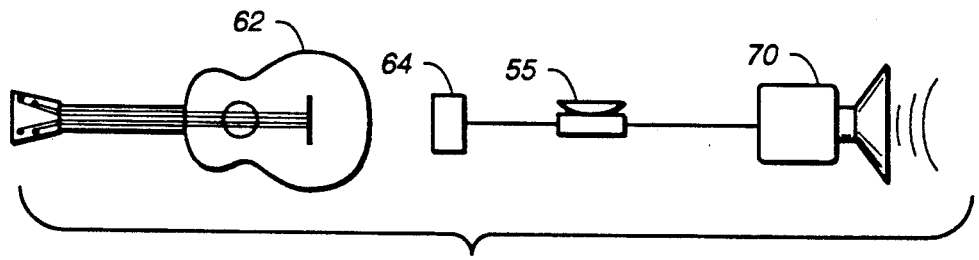
FIG._3
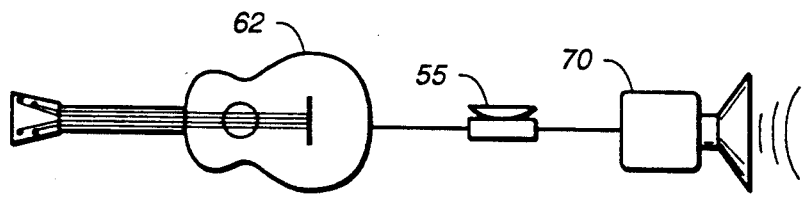
FIG._4
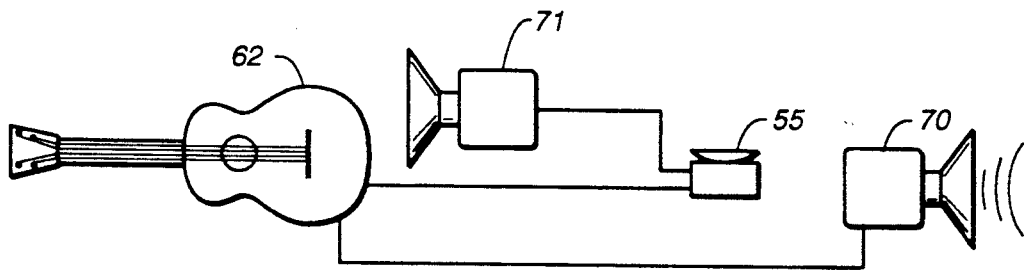
FIG._5
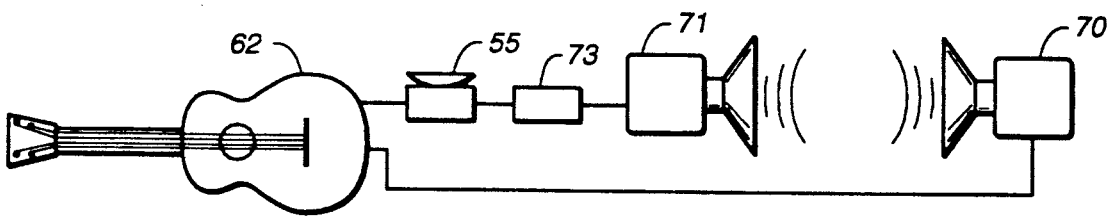
FIG._6

5,274,710

PEDAL VOLUME CONTROL FOR ELECTRIC INSTRUMENTS

BACKGROUND

1. Field of the Invention:

This invention relates to devices for controlling the strength of signal from electric musical instruments and particularly to a signal control device operated by the user with a foot pedal.

2. Prior Art and Information Disclosure Statement:

Musical presentations to a live audience depend heavily on electronic control of the amplifying system that transmits the sound from the performer to the audience. This is especially true with musical groups that use electric guitars and other electric musical instruments. There are a number of effects that are sought after by appropriate operation of the volume control (control of signal strength) on one or more amplifiers by a sound engineer. For example:

It is generally desired to turn up the volume from a singer's microphone when he is singing a solo and then to turn the volume back down when the returns to the group.

Certain musical numbers feature one instrument such as the piano, drums, etc. and for these numbers it is desirable to turn up the volume of a microphone located close to the instrument.

Some musical arrangements featuring electric instruments such as electric guitars, xylophones, etc. require wide swings of volume in certain parts of the arrangement.

Certain stereophonic effects can be achieved by varying the volume from one microphone used in conjunction with another microphone.

According to present practice, a "sound engineer" located off stage operates the volume controls of the amplifiers to the public address system. Obviously, his operation must be very closely coordinated with the musicians' rendition. Therefore, he must have a high degree of familiarity with the musical number. Preferably, the sound engineer is a permanent member of the musical group.

If the musical group does not have a sound engineer, then the musical soloist, himself, is sometimes required to leave the stage to change the volume in accordance with the requirements of the musical rendition.

THE INVENTION

Objects

It is an object of this invention to provide a device that may be used to control the volume (strength) of signal transmitted from a microphone to a public address system.

It is another object that the device may be used to control the volume of signal from one loudspeaker relative to the volume from another loudspeaker in a stereophonic public address system.

It is another object that the device may be used to provide a vibratory quality to the musical rendition.

It is another object that the device may be operated conveniently by the musician onstage so that he has complete control over the volume from his microphone to the public address system thereby eliminating the need for a sound engineer.

It is another object that the signal be controllable by the musicians foot thereby avoiding the necessity of having the musician interrupt his performing in order to change the strength of the signal.

It is another object that the device be capable of exerting continuous changes rather than discrete changes of volume so that effects such as vibration and stereophonics may be introduced by the musician into the musical rendition.

SUMMARY

This invention is directed toward a device which a musician may operate with his foot to control the volume of signal sent from the preamp of his microphone or musical instrument to the amplifier of a public address system. The device includes a resistive impedance that is preset to determine maximum and minimum levels of impedance in series with an additional impedance whose value is controlled by foot.

DRAWINGS

FIG. 1 shows a first embodiment of a circuit of this invention used to control volume of signal from the preamplifier of a microphone or musical instrument to a public address system.

FIG. 2 shows a second embodiment of a circuit of this invention used to control volume of signal from the preamplifier of a microphone or electric instrument to a public address system.

FIG. 3 shows the pedal volume controller used with an accoustic guitar.

FIG. 4 shows the pedal volume controller used with an feedback amplifier.

FIG. 6 shows the pedal volume control used to provide controlled vibrato.

DESCRIPTION OF THE BEST MODE:

The following detailed description illustrates the invention by way of example and not by way of limitation of the principles of the invention. This invention will clearly enable one skilled in the art to make and use the invention and describes several embodiments, adaptations, variations, alternatives and uses of the invention including what I presently believe is the best mode for carrying out the invention.

Turning now to a discussion of the drawings, there is shown in FIG. 1 one embodiment of a circuit diagram 10 constructed in accordance with the invention.

Socket terminals 11, 13 and 15 belong to the inlet plug 9 that receives the balanced signal from the preamplifier (not shown) of the microphone or electric instrument. Plug terminal 15 is connected to ground. Plug terminals 11 and 13 are connected respectively to variable terminals 17 and 19 of potentiometers 21 and 23. Output terminals 25 and 27 of potentiometers 17 and 19 are connected respectively to variable terminals 29 and 31 of potentiometers 33 and 35. Output terminals 37 and 39 are connected respectively to output terminals 48 and 50 of output plug 52. Terminal 53 of plug 52 is connected to ground.

Potentiometers 17 and 19 are ganged together and operated manually. Potentiometers 33 and 35 are ganged together and operated with a foot rocker pedal 55. The "rocker" pedal provides that, with the foot on the pedal and the toe pressed down so that the pedal rocks forward, ganged variable resistors 33 and 35 will be set at their maximum value of resistance. When the heel is depressed, the variable ganged resistors 33 and 35 will assume their minimum values of resistance.

Although I do not wish to be bound by theory, it is believed that the basic operation principle of the first embodiment is to vary the magnitude of signal coming into the input plug 9 from the microphone by varying the series resistance between the variable impedance 57 and the amplifier (not shown) of the public address system.

The procedure is to first press the toe down on the pedal to minimize resistance of potentiometers 29 and 31 then (with toe depressed) to manually adjust potentiometers 17-19 for desired maximum volume of signal. Then the heel is depressed to a position corresponding to minimum desired output and a limiting (stop) screw is manually adjusted to present a "stop" to any further depression of the heel.

A second embodiment of the invention is shown in FIG. 2 which is characterized by a wider range of volume control, with no increase in noise level. For example, the volume range for the first embodiment was 0 db to −14 db compared to 0 db to −50 db for the second embodiment.

Referring to the second embodiment shown in FIG. 2, socket terminals 12, 14 and 16 belong to the inlet plug 8 that receives the balanced signal from the preamplifier (not shown) of the microphone or electric instrument. Terminal 16 is connected to ground. Terminals 12 and 14 are connected to input terminals 18 and 20 and variable terminals 22 and 24 of manually controlled potentiometers 26 and 28 respectively. Potentiometers 26 and 28 are ganged together, are ten kilo ohm potentiometers, and are manually adjustable.

The output terminals 30 and 32 of potentiometers 26 and 28 are connected to each other through resistor 34 and to input terminals 36 and 38 respectively of potentiometers 40 and 42. The variable contacts 44 and 46 of potentiometers 40 and 42 are connected to terminals 48 and 50 of output plug 52. The output terminals 41 and 43 of potentiometers 40 and 42 are connected respectively to terminals 54 and 56 of variable resistor 60.

Potentiometers 40 and 42 are ganged together and varied by a foot pedal. Variable resistor 60 is varied manually.

The procedure for setting the maximum and minimum signal volume is to first set variable resistor 60 to zero and set footpedal potentiometers 40 and 42 to maximum by depressing the toe on the foot pedal 55. In this condition, ganged potentiometers 26-28 are adjusted to provide the maximum desired signal volume. Then the heel of the foot pedal is depressed and variable resistor 60 is positioned to give the minimum desired signal volume.

The invention is operative over a wide range of values of the fixed and variable resistors however preferred range of values for the variable resistors 26, 28, 40 and 42 is from zero to ten kilo ohm. A preferred value for the fixed resistor 34 is ten kilo ohms which provides approximately 0 to −6 db adjustment range with the toe of the pedal down. Changing this value would either increase or decrease this range inversely. A preferred range of value of variable resistor 60 is from zero to ten kilo ohms.

FIG. 3, 4 and 5 illustrate uses for this invention.

FIG. 3 shows the pedal volume controller of this invention used in combination with an acoustic guitar. An accoustic guitar 62 is placed adjacent to a microphone 64 which is connected to the pedal controlled volume controller 55 of this invention which in turn is connected to the public address system 70.

FIG. 4 shows the pedal volume controller 55 of this invention used in combination with an electric guitar. The output of the preamplifier of the electric guitar 62 is connected to the input terminals of the pedal volume controller 55 whose output terminals are connected to the public address system 70.

FIG. 5 shows the pedal volume controller 55 of this invention used to provide controlled feedback. The signal from the preamplifier of the guitar 62 is fed to the public address system 70 and a parallel line is fed to the pedal volume controller 55 of this invention whose controlled output signal is fed back to an amplifier 71 near the guitar.

FIG. 6 shows the pedal volume control of this invention used to introduce controlled vibrato. The preamplifier of the guitar 62 is connected to the main public address system 70 and a parallel output from the preamp of the guitar 62 is connected to the input of the pedal volume control. The output from the pedal volume controller 55 of this invention is connected to a ROTO-VIBE 73 manufactured by the Dunlop Corp which introduces vibrato in the signal and sends the signal to a second amplifier 71.

In the foregoing paragraphs, a pedal controlled variable impedance circuit has been described which meets the objects of this invention. The variable impedance circuit includes a pair of potentiometers ganged together which are manually adjusted to provide minimum volume of signal from the preamplifier of a microphone or electric instrument and a second pair of potentiometers ganged together that may be conveniently controlled by a foot pedal operated by a musician during his musical rendition.

A number of ways of using the pedal volume controller have been described which produce a variety of effects.

The crux of this invention is a means by which a performer can introduce various effects on his rendition through the use of the foot pedal to control signal volume.

It should be understood that various modifications within the scope of this invention can be made by one having ordinary skill in the art with out departing from the spirit thereof. I therefore wish my invention to be defined by the scope of the appended claims.

I claim:

1. A device for controlling volume of a signal delivered to a public address system from a preamplifier connected to an electric instrument or a microphone, which comprises:

an impedance means having an impedance value and including a pair of input terminal means connectable to said preamplifier and a pair of output terminal means connectable to said public address system;

a first variable resistor with a first input terminal comprising one of said input terminals;

a second variable resistor including a second terminal connected in series with said first variable resistor and another terminal comprising one of said output terminals;

a third variable resistor with a third terminal comprising another one of said input terminals and ganged with said first variable resistor;

a fourth variable resistor with a fourth terminal connected in series with said third variable resistor and including a terminal comprising said other one of said output terminals and ganged with said second variable resistor; and means to permit an operator to manually preset said ganged first and third variable resistors and a footpedal means operably coupled to said second and fourth ganged variable resistors to permit said operator to vary said second and fourth ganged resistors.

2. A device as in claim 1 which comprises a fixed resistor with one terminal connected to said second terminal of said second variable resistor and another terminal connected to said fourth terminal of said fourth variable resistor.

3. A device as in claim 2 wherein;

said second and fourth variable resistors each comprise a potentiometer, each potentiometer including one fixed terminal comprising said second and fourth terminals respectively, each potentiometer including a variable terminal comprising said output terminals respectively, each potentiometer comprising another fixed terminal respectively;

a fifth variable resistor connected between said another fixed terminals of said potentiometers.

4. A device as in claim 1 wherein said first and third variable resistors can be set at a value that is selected from a range consisting of values between zero and ten kilo ohms.

5. A device as in claim 1 wherein said second and fourth variable resistors can be set at a value that is selected from a range consisting of values between zero and ten kilo ohms.

6. A device as in claim 2 wherein said fixed resistor has a value that is selected from a range consisting of values between five kilo ohms to fifteen kilo ohms.

7. A device as in claim 3 wherein said fifth variable resistor can be set at a value selected from a range consisting of values between zero to ten kilo ohms.

* * * * *